United States Patent [19]

Watts et al.

[11] Patent Number: 4,874,240

[45] Date of Patent: Oct. 17, 1989

[54] CHARACTERIZATION OF SEMICONDUCTOR RESIST MATERIAL DURING PROCESSING

[75] Inventors: Michael P. C. Watts, Portola Valley; Thiloma I. Perera, Sunnyvale; David W. Myers; Robert G. Ozarski, both of Livermore; John F. Schipper, Palo Alto; Raul V. Tan, San Jose, all of Calif.

[73] Assignee: Hoechst Celanese, Sommerville, N.J.

[21] Appl. No.: 162,431

[22] Filed: Mar. 1, 1988

[51] Int. Cl.$^4$ .............................................. G01B 11/00
[52] U.S. Cl. ...................................... 356/73; 356/381; 356/432; 356/446

[58] Field of Search ................ 356/73, 381, 382, 432, 356/433, 445, 446, 447, 448

[56] References Cited

U.S. PATENT DOCUMENTS 4,669,873  6/1987  Wirz ...................................... 356/73

Primary Examiner—F. L. Evans
Attorney, Agent, or Firm—Skjerven, Morrill, MacPherson, Franklin & Friel

[57] ABSTRACT

Several methods for evaluating certain changes induced in a film of semiconductor resist material after the coat process and before or at completion of the softbake process, by monitoring thickness of and absorption by a film of resist material.

10 Claims, 4 Drawing Sheets

CHARACTERIZATION OF SEMICONDUCTOR RESIST MATERIAL DURING PROCESSING

FIELD OF THE INVENTION

This invention relates to determination of semiconductor resist material parameters such as percentage of solvent remaining during resist fabrication processes such as softbake.

BACKGROUND OF THE INVENTION

Photoresist and other resist material such as electron beam or ion beam resist is used in semiconductor processing to fabricate masks that allow etching of selected portions of a chip at any level. Resist materials are usually organic polymers that change state in response to irradiation of small portions of the resist material by a beam of photons (visible, ultraviolet, X-ray) or charged particles such as electrons or ions. In a positive resist material, irradiation produces local decomposition of the resist constituents into lower molecular weight polymers so that the etchant attacks these areas more readily than it attacks constituents in the unirradiated areas. In a negative resist material, irradiation produces cross-linking among the polymers so that the resulting higher molecular weight constituents resist etching action more successfully than do constituents in the unirradiated areas. This cross-linking produces a swelling of negative resist material so that optical resolution in a negative resist is usually limited to 1.5 $\mu$m or more. However, positive and negative resist materials are initially fabricated in a similar manner. The substrate is often oxidized or unoxidized Si or GaAs, doped or undoped.

SUMMARY OF THE INVENTION

One purpose of this invention is to provide a method for quantitatively monitoring certain changes induced in a film of resist material as the material is processed in the resist coating and/or softbake operations.

Other purposes of the invention, and advantages thereof, will become clear by reference to the detailed description and accompanying drawings.

To achieve the purposes of the invention, the method in one embodiment may include the steps of: determining the thickness of the resist film through a measurement of Total Reflectivity or Total Transmissivity of the resist film at each of a sequence of one or more predetermined wave lengths $\lambda_1, \lambda_2, \ldots, \lambda_r$ at a sequence of one or more predetermined film incidence angles $\theta_{1,1}, \theta_{1,2}, \ldots, \theta_{1,s}$ (with $r+s \geq 3$); and determining the absorption of the resist material after the coat process and before completion of the softbake process through a measurement of Total Reflectivity or Total Transmissivity of the resist film for a predetermined wavelength $\lambda$, a predetermined film incidence angle $\theta_1$ and predetermined resist film thickness.

DETAILED DESCRIPTION

Figure 1:
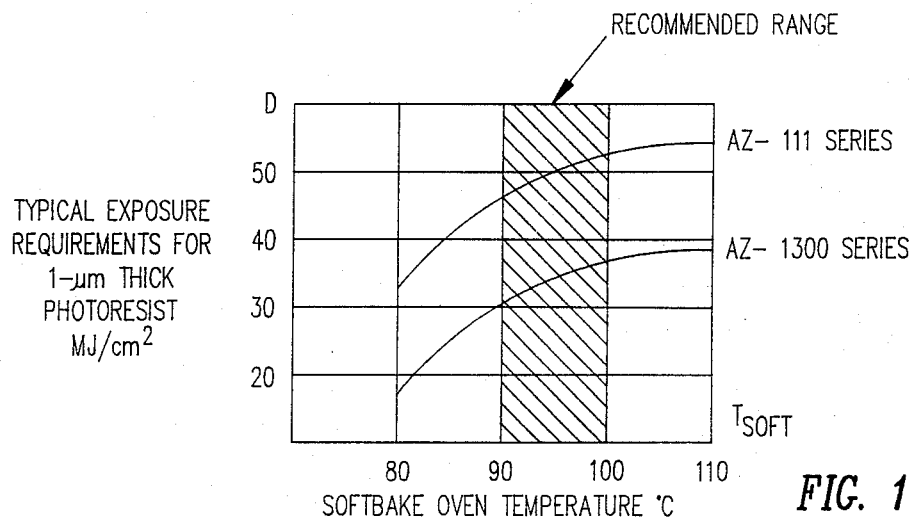
FIG. 1 is a graphic view of typical resist dose D (expressed in millijoules/cm$^2$) required to adequately expose processed resist material 1 $\mu$m thick after the resist has been softbaked at temperature $T_{soft}$ for 10-30 minutes, for two positive photoresist materials.

Photoresist and other resist material is normally applied and used in three or more phases. First, the resist liquid (or gel) is applied at an approximate thickness (usually 100 $\mu$m or more) to one planar surface of a substrate, and the substrate is spun about a central axis to throw off a portion of the resist by centrifugal force and reduce the resist film thickness to a first thickness, as yet unknown. At this point the resist includes both the sensitizer (solute) and the more volatile solvent or liquid vehicle; the solvent continues to evaporate so that film thickness varies with time. If the resist material (with or without the substrate present) is illuminated by electromagnetic radiation (light) of wavelength $\lambda$, for broad ranges of $\lambda$ the solvent is substantially transparent and any absorption in the resist material is due substantially wholly to the solute present in the resist material. Thus, if a fixed amount of solute is uniformly distributed in the resist solvent, the absorption will be independent of resist thickness; and a measurement of absorption will not vary as solvent (only) is removed from the resist material. Here, absorption of the resist film material is taken to be $a = 1 - e^{-\alpha L}$, where L is the length of the optical path of the light within the resist material and $\alpha = \alpha(\lambda)$ is the effective absorptivity coefficient (expressed in units of $\mu m^{-1}$) for propagation of light to wavelength $\lambda$ through the resist material. This definition of absorption uses the well-known Beers-Lambert law for absorption of light, which is a reasonably accurate first approximation for such absorption.

Second, the solvent volatilises and leaves the resist solution, through softbake by infrared or microwave irradiation or evaporation at high ambient temperature for a relatively short time interval (10-60 seconds). The fraction of the resist liquid decreases during softbake from 30-60 weight percent before softbake to 10-20 weight percent at the completion of softbake. This is sometimes referred to as "curing" the resist.

Third, after the resist solvent weight percent has been reduced sufficiently so that the remaining resist solution forms a mechanically stable material, a portion of the resist is masked and the remainder is exposed to a light beam at an appropriate wavelength or to a charged particle beam (for example, electrons or ions) at an appropriate kinetic energy, and subsequently developed or etched. If too much of the solvent remains after softbake and before exposure, a positive resist will become underexposed and a negative resist will incompletely polymerize; and both will manifest poor etch resistance. This behavior is discussed by D. J. Elliott in *Integrated Circuit Fabrication Technology*, McGraw-Hill, 1982, pp. 125-229, which is incorporated herein by reference.

With reference to phase one, a theoretical equation
h = resist thickness after spin = $kp^2/(\omega)^{\frac{1}{2}}$,
p = percentage of solids in resist, $\omega$ = spin rate (rpm),
k = spin-coater constant,
is known to be inaccurate for many of the spray and roller coating environments used in preparation of resist films and for different spin times (normally, 10-30 seconds). Thus, it is of interest to independently determine the resist film thickness after completion of the coating process, and possibly at various times during and at completion of the softbake process. Further, the percentage of solute, especially of the sensitizer, present in the coated resist film and its uniformity of distribution throughout the film need to be determined. The subject invention allows accurate measurements of film thickness and film absorption at any time after completion of the coating process.

Figure 2:
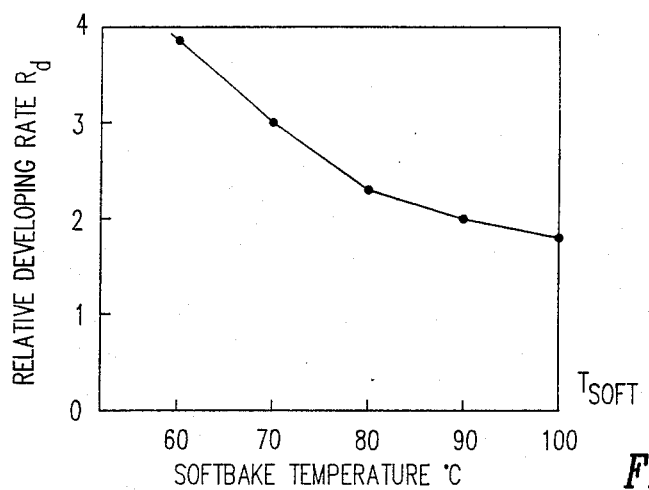
FIG. 2 is a graphic view illustrating rate of dissolution $R_d$ (in arbitrary units) of a representative resist versus softbake temperature $T_{soft}$.

With reference to phase two, when resist solvent is removed by softbake (at temperatures T = 60°-140° C.), a very small portion of the sensitizer is also removed or converted by this process, and this portion appears to increase monotonically with increasing softbake temperature $T_{soft}$. As the fraction converted increases, the total exposure or dose required for optimum contrast or line resolution also rises, as illustrated in FIG. 1 for two typical positive resist families of materials, Shipley AZ-111 and Shipley AZ-1300. Positive resists that are under-softbaked are more easily attacked by the developer in both exposed and unexposed (masked) areas; although this may indicate increased sensitivity or photosensitivity, resolution suffers here as image and nonimage regions are both attacked and etched, and contrast suffers. Negative resist materials have a similar problem; under-softbaking leads to incomplete polymerization in exposed areas of the resist, and the exposed and unexposed areas are attacked more easily, with a concomitant fall in contrast. Contrast is defined here as the ratio $$C = \frac{I_{max} + I_{min}}{I_{max} - I_{min}}$$

where $I_{max}$ and $I_{min}$ are the maximum and minimum radiation intensities, respectively, sensed through the exposed and developed (etched) resist. This characteristic, higher dissolution rate of the resist material as one decreases $T_{soft}$, is illustrated generically in FIG. 2. In a positive resist, dissolution rate $R_d$ is determined by $T_{soft}$, by the time interval $\Delta t_{soft}$ of softbake, and by the manner (convection, conduction, infrared, microwave, rf, etc.) in which the thermal energy is delivered. In a negative resist, $R_d$ depends upon all these variables and also upon degree of polymerization of the resist material.

At the other extreme, if the softbake temperature is too high, or if the softbake time interval $\Delta t_{soft}$ is too long (for example, $T_{soft} > T_{threshold} \approx 120°$ C.), the solute will become degraded and lose some of its sensitivity. In practice, this often limits softbake temperatures to a range of 80° C.-120° C. and to time intervals $\Delta t_{soft}$ = 0-.2-60 minutes. Softback temperature appears to have more of an effect than softbake time on thickness of a resist material coated on a substrate.

Figure 3:
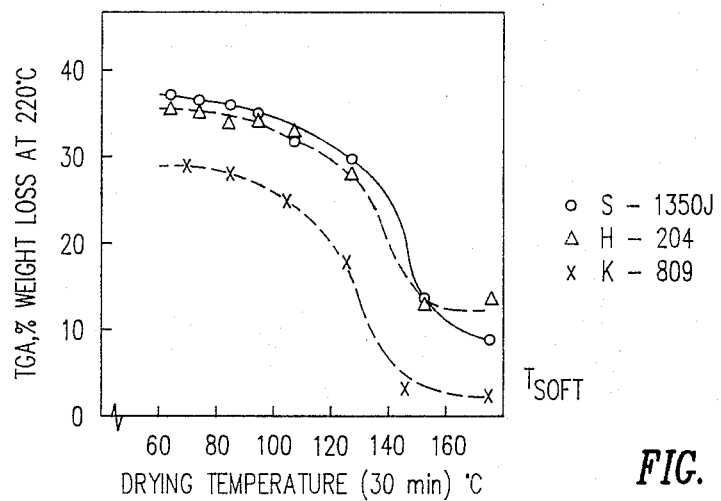
FIG. 3 is a graphic view of weight percentage of solvent remaining after softbake for 30 minutes at temperature $T_{soft}$.
Figure 4:
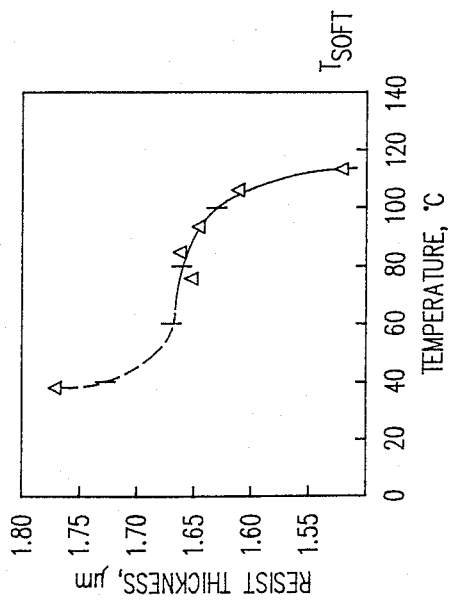
FIG. 4 is a graphic view of changes in resist thickness after softbake versus $T_{soft}$.

FIG. 3 graphically illustrates remaining solvent content (weight-percent) after a time interval $\Delta t_{soft}$ = 30 min. at a sequence of temperatures $T_{soft}$ = 60° C.-140° C. for three representative resist materials, Shipley AZ-1350J, Hunt Waycoat HPR 204 and Kodak Micro Resist 809. Note the precipitous fall in remaining solvent content as $T_{soft}$ increases above 120° C. This accelerated loss of solvent, possibly due in part to conversion of solute molecules, leads to a reduction in resist thickness that can be correlated with $T_{soft}$, for fixed $\Delta t_{soft}$ and fixed manner of delivery of thermal energy, as illustrated in FIG. 4 for a representative material such as AZ-1350J. In FIG. 4, the resist thickness may change relatively little (by about two percent) in the range 60° C. $\leq T_{soft} \leq$ 100° C., but this thickness appears to change sharply above or below this temperature range.

Figure 5:
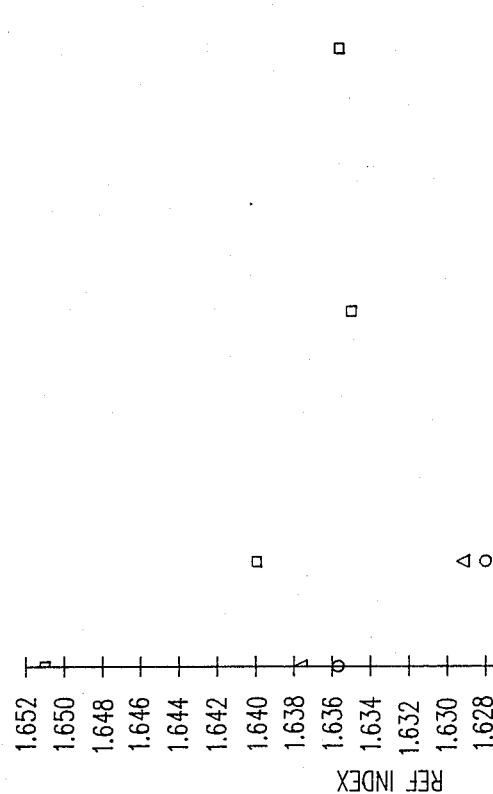
FIG. 5 is a graphic view of the change of refractive index with increasing dose, for five resist materials.

The solvent component of the resist is substantially transparent for the wavelengths of interest ($\lambda$ = 0.3 − 0.5 $\mu$m) for electromagnetic radiation exposure in the third phase. The solute alone contributes to absorption at such wavelengths, but both solute and solvent may contribute to the real component of the refractive index $n = n_r + \iota n_i$ ($\iota^2 = -1$) of the resist solution. Here, the solvent percentage varies over a narrow range, over which the refractive index of the solute/solvent combination is substantially constant and thus can be determined ab initio. The refractive index of a resist material appears to decrease monotonically with increasing dose (mJ/cm$^2$), as illustrated in FIG. 5 for five resist materials, Shipley AZ-1350B, 1350J, 1370, 4110 and 5214.

Eastman Kodak, in its data sheets on Kodak Micro Positive Resist 809, notes that the refractive index n of resist 809 increases with increasing $T_{softbake}$; for example, n increases by approximately 0.02 as $T_{softbake}$ increases from 70° C. to 100° C. If the photoresist material has a well defined refractive index n, standing waves can develop for certain resist thicknesses h =

$$(2k + 1)\frac{\lambda}{4n}$$

(k = 0,1,2, . . . ) that are illuminated with monochromatic light of wavelength $\lambda$; radiation field intensity nulls or minima will occur at regularly spaced intervals across the resist thickness, the result of destructive interference of the light waves. This manifests itself as a scalloped pattern that sharply degrades mask or line width control.

A central idea here is to use changes in particular chemical and physical characteristics of the resist material as it is processed to independently monitor or evaluate the quality of the coating process and the softbake process.

The invention is applicable to positive resist and photoresist materials, including Kodak Micro Resist 809, Hunt Waycoat HPR 204 and 206, Ohka OFPR-800, MIT IC 528, and Shipley AZ 111S, 111H, 1350J, 1370, 1450J and 2400. The invention is also applicable to negative resist and photoresist materials, including Kodak Micro Resist 747 and 752, Hunt Waycoat HNR 80, HNR 120, SC 100 and HR 100, MIT Isopoly MR and HD, Ohka OSR, and KTI 732, 747 and 752. Positive and negative resists use different solvents as well as different photosensitizers. For example, the AZ 1350 and 1370 positive photoresists use 2-ethoxyethyl acetate, and AZ 1512 and 1518 use propylene glycol monoethyl ether acetate as solvent; and the KTI negative photoresists 732, 747 and 752 use xylene as solvent. Typical recommended doses of positive resist materials (e.g., 80-256 millijoules/cm$^2$ for Kodak Micro Resist 809) appear to be two to five times as large as typical recommended doses for negative resist materials of similar thicknesses and wavelengths (e.g., 45-55 millijoules/cm$^2$ for Kodak 747).

Copending U.S. Pat. applications Ser. No. 07/134,638 by R. V. Tan et al. (filed 18 Dec. 1987) and Ser. No. 07/135,119 by D. W. Myers et al. (filed 18 Dec. 1987) disclosed inventions for determining the thickness and refractive index (at a predetermined wavelength) of a film of material and for determining the absorption corresponding to propagation of light of a predetermined wavelength $\pi$ through a film of material of known thickness and refractive index, when the film is mounted on a substrate of known refractive index at that wavelength. The disclosures of these two applications are incorporated herein by reference.

The Tan et al. application discloses a first method (herein called the "Reflectivity Inversion Method") for determining thickness h of the film (having predetermined refractive index $n_2(\lambda_1)$) by appropriately inverting the equation $$\cos\left(\frac{4\pi n_2(\lambda)}{\lambda} h \cos\theta_2\right) = \frac{R_j(1 + r_{12}^2 r_{23}^2) - r_{12}^2 - r_{23}^2}{2(1 - R_j)r_{12}r_{23}},$$

$$\cos\theta_2 = [1 - \sin^2\theta_1/n_2(\lambda)^2]^{\frac{1}{2}},$$

$$\cos\theta_3 = [1 - \sin^2\theta_1/n_3(\lambda)^2]^{\frac{1}{2}},$$

for each of a sequence of predetermined wavelengths $\lambda = \lambda_1, \lambda_2, \ldots, \lambda_w$ ($w \geq 2$), where $\theta_1$ is a predetermined incidence angle of the light beam, $R_j$ is measured Total Reflectivity of the beam intensity from the film at wavelength $\lambda = \lambda_j$ ($j = 1, 2, \ldots, w$), $\theta_2$ and $\theta_3$ are the angles of refraction in the film and in the underlying substrate, respectively, $n_3(\lambda)$ is the substrate refractive index, and $r_{12}(\lambda)$ and $r_{23}(\lambda)$ are the calculated Fresnel amplitude reflection coefficients for reflection within air (or vacuum) and within the film material at an air-film interface and at a film-substrate interface, respectively, for a predetermined beam polarization (p-wave or s-wave).

A second method (herein called the "Reflectivity Versus Wavelength Variance Method) for thickness determination dcisclosed in the Tan et al. application begins with a fixed incidence angle $\theta_1$, a sequence of predetermined film thickness numbers $\{h_1\}^M_{i=1}$ with $h_{min} \leq h_1 < h_2 < \ldots < h_M \leq h_{max}$, and a sequence of predetermined wavelengths $\lambda_1, \lambda_2, \ldots \lambda_w$ and (1) generates two computed arrays of numbers $$R_{ij} = R(\theta_1; \lambda_j; t_i) = \frac{r_{12}^2 + 2r_{12}r_{23}\cos\beta_{ij} + r_{23}^2}{1 + 2r_{12}r_{23}\cos\beta_{ij} + r_{12}^2 r_{23}^2}$$

$$\beta_{ij} = \frac{4\pi n_2(\lambda_j)h_i}{\lambda_j} \cos\theta_2,$$

$$\sin\theta_1 = n_2(\lambda_j)\sin\theta_2 = n_3(\lambda_j)\sin\theta_3,$$

(2) forms a sequence $\{X_R(h_i)\}^M_{i=1}$ of variance numbers $$X_R(h_i|\lambda) = \left[\frac{1}{w} \sum_{j=1}^{w} (R_{ij} - R'(\theta_1; \lambda_j))^2\right]^{\frac{1}{2}},$$

where $R'(\theta_1; \lambda_j)$ = measured film reflectivity at wavelength $\lambda_j$, and (3) chooses a value of film thickness $h = h_k$ for which $X_R(h_k)$ is a minimum among the sequence $\{X_R(h_i)\}_i$.

In a third method (herein called the Reflectivity Versus Incidence Angle Variance Method") for thickness determination, the Total Reflectivity values R are computed for each of a sequence of predetermined incidence angles $\{\theta_{1,g}\}^v_{g=1}$ ($v \geq 2$) and a fixed wavelength $\lambda_1$; this yields an array of Total Reflectivity values R ($\theta_{1,g}$; $\lambda_1$; $h_i$), where $h_i$ as before is drawn from a sequence of predetermined thickness numbers $\{h_i\}^M_{i=1}$. Reflectivity measurements are made on the film/substrate combination with unknown film thickness at each incidence angle $\theta_{1,g}$ at the wavelength $\lambda_1$; these yield a sequence of measurements $\{r(\theta_{1,g}; \lambda_1)\}^v_{g=1}$. One then computes the variance $$X_R(h_i|\theta) = \left[\frac{1}{v} \sum_{g=1}^{v} (R(\theta_{1,g};\lambda_1;h_i) - R(\theta_{1,g};\lambda_1))^2\right]^{\frac{1}{2}}$$

and chooses as the film thickness h the thickness $h_i$ corresponding to minimum variance; if two or more distinct values of thickness h yield substantially the same variance $X_R(h_i|\theta)$, other criteria should be invoked to determine which of these values of granular thickness is preferred.

All three of these methods rely on measurement of Total Reflectivity R, defined here as $$R = \frac{r_{12}^2 + 2r_{12}r_{23}\cos\beta + r_{23}^2}{1 + 2r_{12}r_{23}\cos\beta + r_{12}^2 r_{23}^2},$$

$$\beta = \frac{4\pi n_2 h_2}{\lambda} \cos\theta_2,$$

where $r_{12}$ and $r_{23}$ are the Fresnel amplitude reflection coefficients. These methods, and any other method of determining thickness of a film mounted on a substrate by measurement and use of Total Reflectivity at a sequence of wavelengths or a sequence of film incidence angles, may be used with the invention disclosed herein.

The Myers et al. application discloses four methods for determining the absorption $a = 1 - e^{-\alpha L}$, corresponding to propagation of light of a predetermined wavelength $\lambda$ along an optical path of length L through a substantially planar film of material of known refractive index $n_2(\lambda)$ (real or complex) and thickness $h_2$ that is mounted on a substrate having known refractive index $n_3(\lambda)$. In a first method (herein called the "Simple Reflectivity Method"), $n_2$ is assumed to be real, and one propagates the light beam through air (or vacuum) to the air-film interface at a predetermined incidence angle $\theta_1$ and measures the Total Reflectivity $R = I_{reflected}/I_{incident}$ of the incident beam intensity and determines the absorption a substantially from the expression $$1 - a = \{-r_{12}(1 - R)\cos\beta_2 \pm [r_{12}^2(1 - R)^2\cos^2\beta_2 + (R - r_{12}^2)(1 - R_{12}^2)]^{\frac{1}{2}}\}/r_{23}(1 - Rr_{12}^2),$$

$$\beta_2 = \frac{4\pi n_2 t_2}{\lambda} \cos\theta_2$$

$$L_2 = t_2 \sec\theta_2$$

$$\cos\theta_2 = [1 - \sin^2\theta_1/n_2^2]^{\frac{1}{2}},$$

$$\cos\theta_3 = [1 - \sin^2\theta_1/n_3^2]^{\frac{1}{2}},$$

where $r_{12}$ and $r_{23}$ are the (real) Fresnel amplitude reflection coefficients for the film-air interface and the film-substrate interface, respectively, both within the film material, for the chosen polarization of the incident beam.

In a second method (herein called the "Complex Reflectivity Method"), the (complex) film and substrate refractive indices $n_2 = n_{2r} + \iota n_{2i}$ (known) and $n_3 = n_{3r} + \iota n_{3i}$ (known) with $\iota^2 = -1$ are used to determine each component of the complex refraction angles $\theta_a = \theta_{ar} + \iota \theta_{ai}$ (a=2,3) by manipulation of the relation $r_{ir} \sin \theta_1 = (n_{ar} + \iota n_{ai}) (\sin \theta_{ar} \cos h\theta_{ai} + \theta \cos \theta_{ar} \sin h\theta_{ai})$ (a=2,3). The complex Fresnel amplitude reflection and transmission coefficients $r_{ij}$ and $t_{ij}$ (i,j=1,2,3; i≠j) are determined as ratios of solutions of certain linear equations (boundary conditions) between the electric and magnetic field strength variables E and H. Measurement of Total Reflectivity $R_{meas}$ at the air-film interface and comparison with the calculated Total Reflectivity $$R = \left| r_{12} + \frac{t_{12}t_{23}t_{21} \exp(\iota q L \eta) \exp(-\alpha L)}{1 - r_{21}r_{23}\exp(\iota q L \eta) \exp(-\alpha L)} \right|^2$$

yields a quadratic equation in exp $(-\alpha L)$ whose solution is $$1 - a = \exp(-\alpha L) = [u \pm (u^2 - tv)^{\frac{1}{2}}]/t$$

where t, u and v are polynomials on the variables $R_{meas}$, $r_{ij}$ and $t_{ij}$ (i,j=1,2,3; i≠j) computed in the Myers et al. application.

In a third method (the "Simple Transmissivity Method"), the Total Transmission $T_{meas} = I_{transmitted}/I_{incident}$ (through film and substrate) of incident beam intensity is measured, and one determines the absorption $a = 1 - e^{-\alpha_2 L_2}$ substantially from the expressions $$\exp[-2\alpha_2 L_2] = \{(r_{21}r_{23}\cos\beta_2 + 1/FT_{meas}) \pm [(r_{21}r_{23}\cos\beta + 1/FT)^2 - r_{21}^2 r_{23}^2]^{\frac{1}{2}}\}/r_{21}^2 r_{23}^2,$$

$L_2$ = one-pass optical path length in film = $t_2 \sec \theta_2$,
$\alpha_2$ = absorption coefficient for film material,
$F/2 = \{e^{2\alpha_3 L_3} - 2r_{31}r_{32} \cos \beta_3 + r_{31}^2 r_{32}^2 e^{-2\alpha_3 L_3}\}/(1 - r_{12}^2)(1 - r_{23}^2)(1 - r_{31}^2)$,
$\beta_3 = 4\pi n_3 t_3 / \lambda \cos \theta_3$,
$t_3$ = substrate thickness,
$L_3$ = one-pass optical path length in substrate = $t_3 \sec\theta_3$,
$\alpha_3$ = absorption coefficient for substrate material, where the (real) Fresnel amplitude reflection coefficients $r_{ij}$ and $\beta_2$ and $L_2$ are computed as in the first method.

In a fourth method (the "Complex Transmissivity Method"), the complex film and substrate refractive indices $n_2 = n_{2r} + \iota n_{2i}$ (known) and $n_3 = n_{3r} + \iota n_{3i}$ (known) are used to determine each component of the complex refraction angles $\theta_a = \theta_{ar} + \iota \theta_{ai}$ (a=2,3) and the complex Fresnel amplitude reflection and transmission coefficients $r_{ij}$ and $t_{ij}$ (i,j=1,2,3; i≠j) as in the second method. The absorption $a = 1 - e^{-\alpha_2 L_2}$ is determined substantially from the expressions $$(1-a)^2 = e^{-2\alpha_2 L_2} = [u' \pm (u'^2 - t'v')^{\frac{1}{2}}]/t',$$

where t', u' and v' are polynomials in the variables $T_{meas}$, $r_{ij}$ and $t_{ij}$ (i,j=1,2,3; i≠j) computed in the Myers et al. application.

The absorption $a_o = 1 - e^{-(\alpha L)_o}$ of the bare substrate surface is first measured and stored. Here, the single parameter $(\alpha L)_o$ measures any absorption or related anomalies that occur at the surface of the bare substrate, based upon substrate refractive index and theoretical reflectivity of the substrate surface.

The resist material is then deposited on one or a plurality of wafers (20 is a convenient batch size) at estimated thicknesses of 1 μm, and the wafers are spun. The wafers are then allowed to settle for a period of time (optional), and coating thickness is measured for each wafer, using measurement of Total Reflectivity such as the Reflectivity Inversion Method, the Reflectivity Versus Wavelength Variance Method or the Reflectivity Versus Incidence Angle Variance Method discussed above, or any other suitable method such as ellipsometry. The wavelength(s) λ of irradiation for the thickness determination should be chosen so that the refractive index n(λ) is real, or substantially so. For many resist materials, the refractive index $n = n_r + \iota n_i (\iota^2 = -1)$ satisfies $n_i < 0.01$ for all λ > 0.5 μm so that this constraint is easily met.

Figure 6:
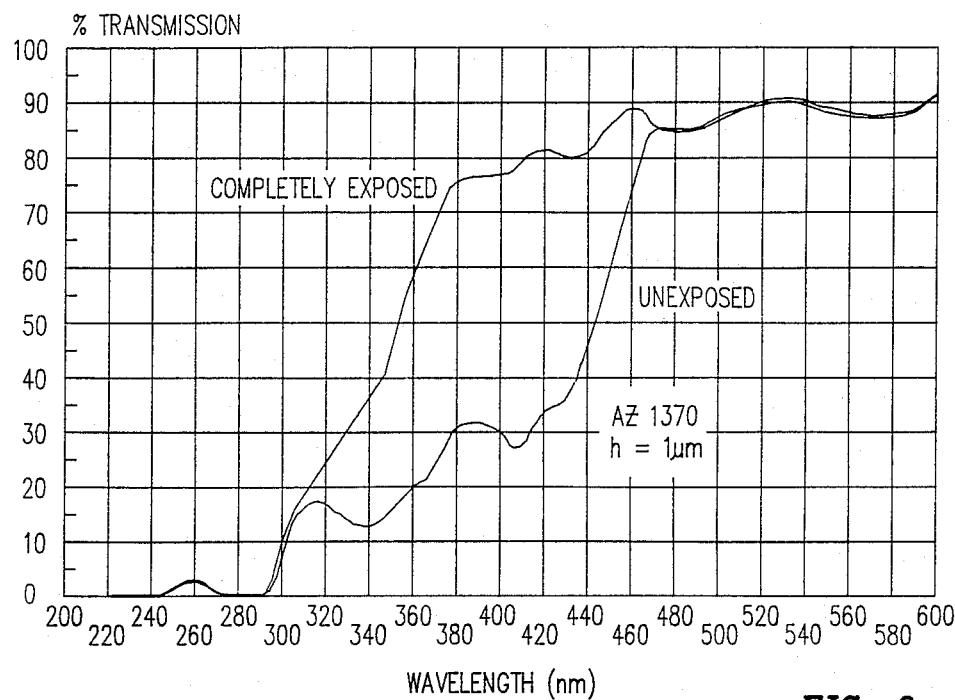
FIGS. 6, 7 and 8 are graphic views illustrating percentage transmission for three American Hoechst resist materials, AZ1370, AZ4110 and AZ5214-E for resist thicknesses of 1 $\mu$m, 1 $\mu$m and 1.15 $\mu$m, respectively.
Figure 7:
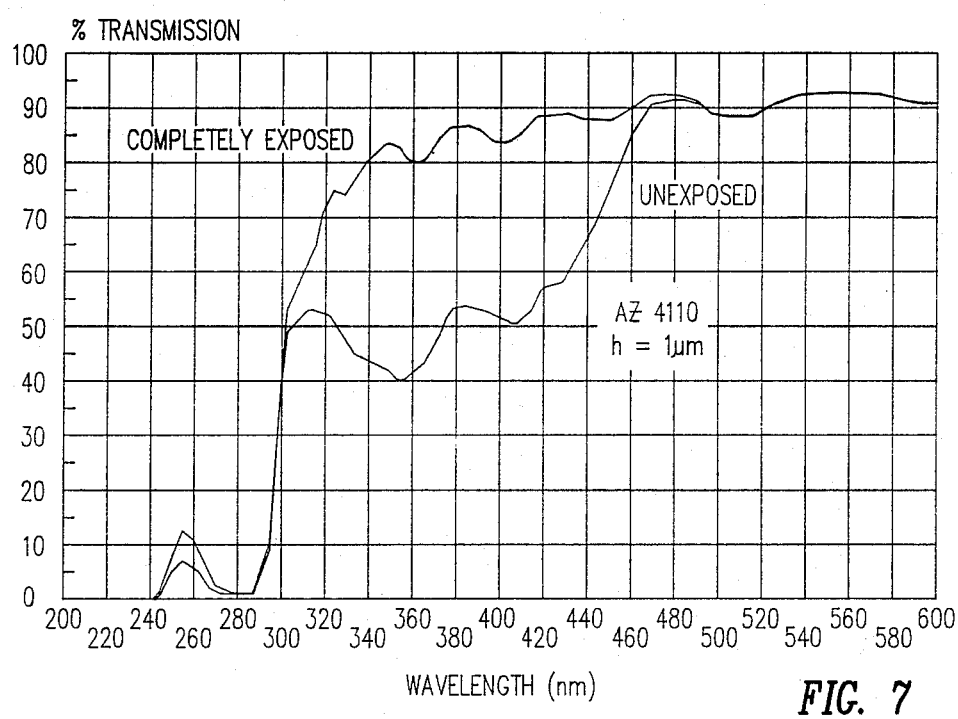
Figure 8:
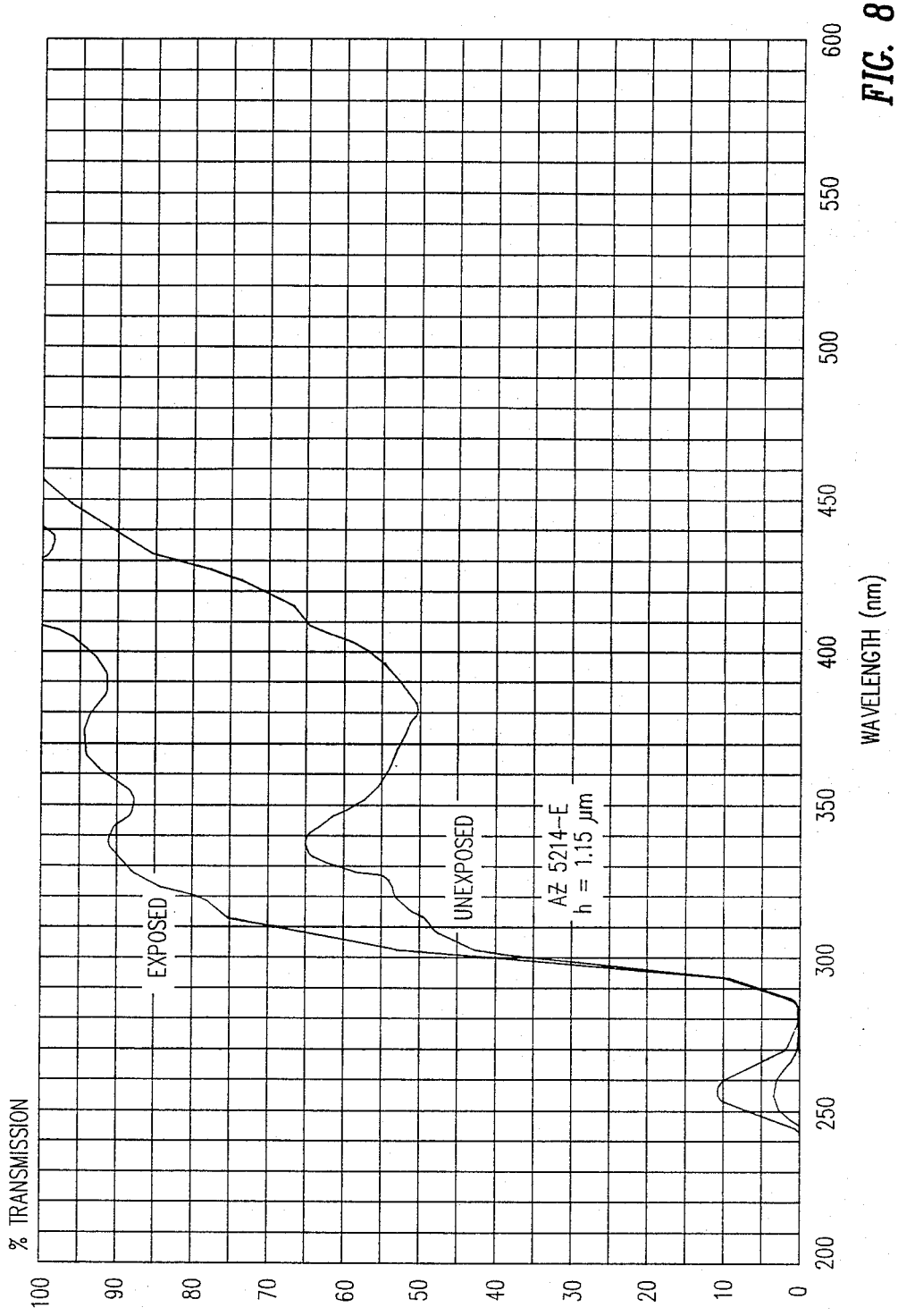

FIGS. 6, 7 and 8 illustrate the percentage transmission of three representative Hoechst positive resist materials, AZ 1370, AZ 4110 and AZ 5214-E as a function of irradiation wavelength λ for thicknesses of 1 μm, 1 μm and 1.15 μm, respectively. From Eqs. (16)–(21) of the Myers et al. Application, the propagation vector q appears in the form $$\underline{F} = \underline{E}_o \exp[\iota(\underline{q} \cdot \underline{r} - \omega t)],$$

$$q^2 = \frac{\omega}{c} (n_r + \iota n_i)^2,$$

where E is the electric field strength vector and $\omega = 2\pi c/\lambda$ is the angular velocity corresponding to the irradiation wavelength. The intensity transmission factor $\tau$ corresponding to propagation of a light wave through a thickness h of such material then becomes Y $\exp(-2\omega h n_i/c)$ so that the imaginary component of the refractive index $n_i$ becomes $$n_i = (\lambda/4\pi h) \ln(1/\tau).$$

Table I presents the computed values of $n_i$ for AZ 1370, AZ 4110 and AZ 5214-E for some representative wavelengths λ = 0.365 μm, 0.405 μm, 0.442 μm and 0.5 μm, for unexposed and completely exposed resist materials. For each resist material there exists a "window", in the wavelength range within which $n_i$ (unexposed) differs substantially from $n_i$ (completely exposed); this window is given approximately by 0.3 μm < λ < 0.48 μm for the three resist materials shown in FIGS. 6, 7 and 8.

TABLE I.

| Imaginary Component of Refractive Index ($n_i$). | | | | |
|---|---|---|---|---|
| | λ = 0.365 μm | λ = 0.405 μm | λ = 0.442 μm | λ = 0.05 μm |
| AZ 1370 | | | | |
| $n_i$(unexp.) | 0.0467 | 0.0410 | 0.0244 | 0.0060 |
| $n_i$(exposed) | 0.0148 | 0.0093 | 0.0074 | 0.0060 |
| AZ 4110 | | | | |
| $n_i$(unexp.) | 0.0226 | 0.0223 | 0.0131 | 0.0042 |
| $n_i$(exposed) | 0.0058 | 0.0049 | 0.0049 | 0.0042 |
| AZ 5214-E | | | | |
| $n_i$(unexp.) | 0.0142 | 0.0157 | 0.0019 | 0 |
| $n_i$(exposed) | 0.0130 | 0 | 0 | 0 |

The wafers are then measured for absorption $a = 1 - e^{-\alpha L}$ (L = single pass optical path length, α = absorptivity coefficient), using a measurement of Total Reflectivity or of Total Transmissivity for the substrate/resist coat combination. This method may be drawn from the Simple Reflectivity Method, the Complex Reflectivity Method, the Simple Transmissivity Method, the Complex Transmissivity Method, or any other suitable method that works with all orders of optical interferences, to determine a or $\alpha$. As noted above, the solvent is substantially transparent to radiation of wavelengths $\lambda = 0.3 - 0.5$ μm so that the absorptivity coefficient $\alpha$ should remain substantially the same throughout the process of (partial) removal of the solvent. The thickness h of, and optical path length L within, the resist material are related approximately by the equation $$L = h \sec \theta_2 = h/[1 - \sin^2 \theta_1/n_{2r}^2]^{\frac{1}{2}},$$

where $\theta_1$ is the incidence angle, $\theta_2$ is the corresponding refraction angle in the resist material and $n_{2r}$ is the real component of the refractive index of the resist material.

The fact that the resist solvent is substantially transparent at the wavelengths of interest allows one to decouple an evaluation of the coat process, using determinations of thickness h and absorptivity coefficient $\alpha$ after coating and before softbake, from an evaluation of the softbake process, using post-softbake values for thickness h. For the coat process, one useful parameter is $$\Delta = \alpha L \text{ (post-coat, pre-softbake)} - (\alpha L)_o \text{ (pre-coat)}.$$

Forming the difference $\Delta$ cancels out any effect on absorptivity due to anomalies at the substrate surface. Ideally, $\Delta$ should be the same for each wafer, indicating that the solute molecules are uniformly distributed throughout the batch of wafers being tested. The parameter $\Delta$ represents "true" absorptivity of the resist material itself; $\Delta$ for each wafer should lie within a narrow range, say ± one percent of the target value $\Delta_t$ for that resist material. Alternatively, $\Delta_t$ may be taken as the arithmetic mean of all the values of $\Delta$ in this batch.

For the softbake process a useful parameter is $$\rho = h(\text{after softbake})/\Delta$$

This provides a measure of absorption in the resist film due to the solute molecules, which are assumed to be substantially the only molecules that contribute to absorption. One might, for example, set a target $\rho_t$ for $\rho$ after softbake and compare each $\rho$ with $\rho_t$ for conformity. Alternatively, one might set $\rho_t$ equal to the arithmetic mean of the $\rho$ values for all of the wafers and compare each $\rho$ with the means value for the process.

The most important feature here is the fact that the coat and softbake processes can now be monitored separately and independently for compliance with predetermined standards for each of these processes. This approach resolves two problems perceived by many workers in this field: (1) After coat and before softbake stabilizes the resist film, the thickness h continues to vary with time as evaporation proceeds; one solution is to use the absorptivity coefficient $\alpha$, which is assumed to arise from the presence of only the solute molecules in the resist of the irradiation wavelength chosen; (2) During the softbake process, one has two parameters ($\Delta$ and h) to work with, with differing units; one solution here is to form the product or the ratio of these two monitor parameters.

Although the preferred embodiments of the invention have been shown and described herein, modification and variation can be made without departing from the scope of the invention.

We claim:

1. A method for evaluating the quality of a semiconductor resist material produced by a softbake process, that contains a solute and a solvent and that is deposited as a substantially planar film on a substrate, the method comprising the steps of:

determining the absorption $a = 1 - e^{-\alpha_o L_o}$ ($L_o$ = single pass optical path length in the film of interest, if any) and absorption coefficient $(\alpha L)_o$ of the substrate surface before the coat process begins, through a measurement of Total Reflectivity of the substrate surface for a predetermined wavelength $\lambda$, predetermined incidence angle $\theta_1$ and known index of refraction of the substrate;

depositing a resist film on the substrate at an estimated predetermined thickness;

determining the thickness of the resist film through a measurement of Total Reflectivity of the resist film at each of a sequence of one or more predetermined wavelengths $\lambda_1, \lambda_2, \ldots, \lambda_r$ at a sequence of one or more predetermined film incidence angles $\theta_{1,1}, \theta_{1,2}, \ldots, \theta_{1,s}$ (with $r + s \geq 3$);

determining the absorption of $a = 1 - e^{-\alpha L}$ of the resist film after the coat process and before completion of the softbake process through a measurement of Total Reflectivity of the resist film for a predetermined wavelength $\lambda$, predetermined film incidence angle $\theta_1$, and predetermined film thickness h;

forming the quantity $\Delta = \alpha L - (\alpha L)_o$ for each of the sequenmce of combinations of substrate and resist film deposited thereon;

comparing the value of $\Delta$ for each such combination with a predetermined target value $\Delta_t$;

performing the softbake process for each such combination;

forming the quantity $\rho = h/\Delta$ for each of the sequence of combinations of substrate and resist film deposited thereon; and comparing the value of $\rho$ for each such combination with a predetermined target value $\rho_t$.

2. The method according to claim 1, wherein said step of determining said thickness of said resist film is carried out using a method drawn from the class consisting of the Reflectivity Inversion Method, the Reflectivity Versus Wavelength Variance Method, and the Reflectivity Versus Incidence Angle Variance Method.

3. The method according to claim 1, wherein said step of determining said absorption of said resist film is carried out using a method drawn from the class consisting of the Simple Reflectivity Method and the Complex Reflectivity Method.

4. The method according to claim 1, wherein said target value $\Delta_t$ is the arithmetic mean of the values of said parameter $\Delta$ determined for said sequence of combinations of substrate and resist film.

5. The method according to claim 1, wherein said target value $\rho_t$ is the arithmetic mean of the values of said parameter $\rho$ determined for said sequence of combinations of substrate and resist film.

6. A method for evaluating the quality of a semiconductor resist material, produced by a softbake process, that contains a solute and a solvent and that is deposited as a substantially planar film on a substrate, the method comprising the steps of:

determining the absorption $a = 1 - e^{-\alpha_o L_o}$ ($L_o$ = single pass optical path length in the film of interest, if any) and absorption coefficient $(\alpha L)_o$ of the substrate surface before the coat process begins, through a measurement of Total Transmissivity of the substrate surface for a predetermined wavelength $\lambda$, predetermined incidence angle $\theta_1$ and known index of refraction of the substrate;

depositing a resist film on the substrate at an estimated predetermined thickness;

determining the thickness of the resist film through a measurement of Total Reflectivity of the resist film at each of a sequence of one or more predetermined wavelengths $\lambda_1, \lambda_2, \ldots, \lambda_r$ at a sequence of one or more predetermined film incidence angles $\theta_{1,1}, \theta_{1,2}, \ldots \theta_{1,s}$ (with $r+s \geq 3$);

determining the absorption $a = 1 - e^{-\alpha L}$ of the resist film after the coat process and before completion of the softbake process through a measurement of Total Transmissivity of the resist film for a predetermined wavelength $\lambda$, predetermined film incidence angle $\theta_1$, and predetermined film thickness h;

forming the quantity $\Delta = \alpha L - (\alpha L)_o$ for each of the sequence of combinations of substrate and resist film deposited thereon;

comparing the value of $\Delta$ for each such combination with a predetermined target value $\Delta_t$;

performing the softbake process for each such combination;

forming the quantity $\rho = h/\Delta$ for each of the sequence of combinations of substrate and resist film deposited thereon; and comparing the value of $\rho$ for each such combination with a predetermined target value $\rho_t$.

7. The method according to claim 6, wherein said step of determining said thickness of said resist film is carried out using a method drawn from the class consisting of the Reflectivity Inversion Method, the Reflectivity Versus Wavelength Variance Method, and the Reflectivity Versus Incidence Angle Variance Method.

8. The method according to claim 6, wherein said step of determining said absorption of said resist film is carried out using a method drawn from the class consisting of the Simple Transmissivity Method and the Complex Transmissivity Method.

9. The method according to claim 6, wherein said target value $\Delta_t$ is the arithmetic mean of the values of said parameter $\Delta$ determined for said sequence of combinations of substrate and resist film.

10. The method according to claim 6, wherein said target value $\rho_t$ is the arithmetic mean of the values of said parameter $\rho$ determined for said sequence of combinations of substrate and resist film.

* * * * *